United States Patent [19]

Zarnoch et al.

[11] Patent Number: 5,346,719
[45] Date of Patent: Sep. 13, 1994

[54] TUNGSTEN METALLIZATION OF CVD DIAMOND

[75] Inventors: Kenneth P. Zarnoch, Scotia; Charles D. Iacovangelo, Schenectady, both of N.Y.

[73] Assignee: General Electric Company, Schenectady, N.Y.

[21] Appl. No.: 100,406

[22] Filed: Aug. 2, 1993

[51] Int. Cl.$^5$ ............................................. B05D 5/12
[52] U.S. Cl. ................................ 427/97; 427/248.1; 427/250; 427/380; 427/383.1; 427/399; 29/846; 29/852
[58] Field of Search ............... 427/248.1, 250, 97, 427/383.1, 380, 399; 29/846, 852; 51/295, 293, 298

[56] References Cited

U.S. PATENT DOCUMENTS

| | | | |
|---|---|---|---|
| 3,650,714 | 3/1972 | Farkas | 427/284 |
| 3,929,432 | 12/1975 | Caveney | 51/295 |
| 4,738,689 | 4/1988 | Gigl et al. | 51/295 |
| 5,024,680 | 6/1991 | Chen et al. | 51/295 |
| 5,239,746 | 8/1993 | Goldman | 427/97 |

OTHER PUBLICATIONS

Article–High Temperature Reliability of Refractory Metal Ohmic Contacts to Diamond, M. Roser et al, Electrochemical Society., vol. 139, No. 7, Jul. 1992–pp. 2001–2003.

Article–Applicability of Diamond Substrates to Multi–Chip Modules, Richard C. Eden, ISHM '91 Proceedings, pp. 363–367.

*Primary Examiner*—Shrive Beck
*Assistant Examiner*—David M. Maiorana
*Attorney, Agent, or Firm*—James Magee, Jr.

[57] ABSTRACT

A process for significantly improving the adhesion of a refractory metal deposited on diamond is disclosed. The process involves depositing an initial thin metal coating by low pressure chemical vapor deposition on diamond, heat treating in a non-oxidizing environment, and continuing the deposition of the initial metal coating until a desired thickness is achieved. Diamond sheets that have undergone the inventive process where 15 micrometers of tungsten are deposited, exhibit tungsten adhesive values in excess of 10,000 pounds per square inch.

16 Claims, No Drawings

TUNGSTEN METALLIZATION OF CVD DIAMOND

CROSS REFERENCE TO RELATED APPLICATIONS

Reference is made to a commonly assigned, copending application, Ser. No. 08/016,367, filed on Feb. 11, 1993, for A Process for Making Metallized Vias in Diamond Substrates.

FIELD OF THE INVENTION

This invention relates to significant improvements in adhesion of metal coatings on diamond and more particularly concerns a method of producing improved adhesion of tungsten on diamond by depositing an initial tungsten coating by low pressure chemical vapor deposition, heat treating, and depositing additional tungsten to a desired thickness.

BACKGROUND OF THE INVENTION

Diamond has been widely used as superabrasive grit in sawing, drilling, dressing, and grinding applications because of its hardness. Diamond is also an attractive choice for use in high frequency, high-power, high temperature, or high radiation field applications. This is due to its wide band gap (5.5 eV), unequaled thermal conductivity (20 W/cm$^2$-K), high electric field breakdown voltage, high electron saturation velocity, and high electron and hole mobilities.

Further, since synthetic diamond is a lightweight insulator with a thermal conductivity four times that of copper, it represents an ideal high performance multichip module substrate. Such use of diamond would not only reduce chip temperatures in conventional 2-D multi-chip modules, but also make it practical to implement ultra high performance, 3-dimensionally interconnected multi-chip modules (see Ser. No. 08/016,367). Thus, there exist many present and potential applications for non-gem and synthetic diamond in the marketplace.

However, in order to use non-gem and synthetic diamonds in industrial applications, a metal coating on the diamond is often required. Depending on the application, the metal coating may need to be several microns thick. This requirement has often been a limitation because of poor adhesion of the metal coating on diamond.

For instance, when diamond is used as superabrasive grit in sawing applications, the grit is typically held in a matrix of nickel, copper, iron, cobalt, or tin, or alloys thereof, by mechanical bonds and the matrix is connected to a tool body. In an attempt to improve grit retention, diamond particles have been coated with carbide forming transition metals, such as titanium or zirconium, by metal vapor deposition. The coating's inner surface forms a carbide with the diamond. A second layer of a less oxidizable metal, such as nickel or copper, can then be applied to protect the inner layer from oxidation.

Tensile testing of double layer coated diamond having an inner layer, such as titanium, and an outer layer, such as nickel, shows that fracturing occurs at the interface between the inner and outer layers. This suggests that the second coating does not bond well with the underlying carbide layer.

In U.S. Pat. No. 3,929,432, Caveney controls the duration of heat treatment in a double coated diamond particle. Using heat treatment after the deposition of the metal coatings, Caveney discloses the formation of a chemical metal-carbide bond between the first metal and diamond, and alloying between the second metal coating and the first metal coating. The patent does not address adhesion between the inner and outer metal coatings when the same metal is used for both coatings.

Chen, in U.S. Pat. No. 5,024,680, further discloses the use of heat treatment in a multiple metal coated diamond grit to improve adhesion between the coatings. A first layer coating, preferably chromium, titanium, or zirconium, forms a chemical metal carbide bond with diamond. A second metal coating of an oxidation resistant carbide former, preferably tungsten or tantalum, is chemically bonded to the first metal layer. A third metal layer coating of an alloying metal, such as nickel, can also be added.

Heat treatment is a preferred step in the process to increase carbidization of the second layer and increase the bond strength between the first and second layers. In Chen's process, the heat treatment is done after the second metal is deposited over the first metal. There is no heat treatment in between the deposition of the initial coating and the second coating. Further, in Chen each coating is a different metal.

Other applications of diamond that require metal coatings are electronic devices. Such devices use a solid-state reaction process for forming adherent ohmic contacts on diamond (see Roser, et al., High Temperature Reliability of Refractory Metal Ohmic Contacts to Diamond, J. Electrochemical Soc.,139(7), 2001-2004 (July 1992)).

The process consists of the deposition of a thin layer of carbide-forming metal on diamond followed by the deposition of a gold cap layer to protect the metal from corrosion. The carbide-forming metals that have been utilized in forming these contacts include molybdenum, titanium, vanadium, and tantalum. After deposition, the contacts are annealed at high temperature in a purified hydrogen environment. Along with the other processes already mentioned, the disadvantage of this process is that it is limited to thin films on the order of a few thousand angstroms.

Recently, diamond has shown promise as a substrate in 3-dimensional multi-chip modules. The ability to produce high density packing of components on diamond substrates is dependent on a technique to pattern and interconnect traces on both sides of the diamond. This can be accomplished by fabricating metallized vias in the diamond (see copending application Ser. No. 08/016,367).

In such an application, a thick coating of a single metal is required because the vias need to be completely filled with a metal which demonstrates good electrical and thermal conductivity, reasonable thermal expansion match to diamond, and strong adhesion to diamond. These requirements generally limit the metallization to refractory metals.

It has been shown that direct deposition of a thick coating of tungsten on diamond by chemical vapor deposition, of about 15-20 microns thick, displays poor adhesion to the diamond. The deposit cracks and peels from the substrate. This occurs even after heat treatment of the substrate and metal deposit.

Presently, the adhesion on diamond of two or more coatings of varying metals can be improved by heat treatment. However, there is still a need to develop a process that provides a tightly adherent thick coat of a single metal on diamond.

Until now, the adhesive strength of tungsten on diamond has generally been limited to a few hundred pounds per square inch. This may be insufficient for some applications. Thus, there is also a need to develop a process that significantly increases the adhesive strength of metal coatings on diamond.

SUMMARY OF THE INVENTION

This invention fulfills these needs by providing a process for improving adhesion of a metal coating on diamond comprising depositing an initial coating of a refractory metal on diamond, heat treating said initial coating to form a refractory metal-carbon bonding layer with the diamond, and then continuing the deposition of the refractory metal to a desired thickness.

Refractory metals are useful in the practice of this invention since they exhibit good electrical and thermal conductivity along with a reasonable thermal expansion match to diamond. The metals may be selected from the group consisting of tungsten, niobium, molybdenum, chromium, titanium, vanadium, tantalum, zirconium, hafnium, aluminum, and mixtures of said metals. Mixture of said metals means alloys of refractory metals, deposited as a single coating. Mixture does not mean a combination of refractory metals being deposited as separate coatings.

The initial coating of the refractory metal on diamond is a thin amount that forms a refractory metal-carbon bonding layer with the diamond at elevated temperatures during heat treatment. Typically, the coating is deposited by low pressure chemical vapor deposition. Other methods of deposition may include sputtering, physical vapor deposition, and wet chemical methods, such as electroless deposition and electrolytic deposition.

The thickness of the first coating is about 10–10,000 angstroms. It is important to this invention that the first coating be thin so as to minimize the stress at the interface between the coating and the diamond. Also, a uniform, thin coating provides intimate contact between the two materials.

Heat treating after depositing the initial coating of the refractory metal is essential to this invention. This is because heat treating the initial coating forms the refractory metal-carbon bonding layer, which strengthens the adhesion of the subsequent metal coating. It has also been found that heat treatment allows a rapid cooling rate of the substrate at the end of the process after the desired deposit thickness is obtained.

After heat treatment, the initial coating is no longer a discrete layer of uniform composition. The refractory metal-carbon bonding layer formed between the initial deposit of refractory metal and the diamond substrate can be of the type where adhesion results from a mechanism that entails interdiffusion between the refractory metal and the carbon, forming an intricately mixed matrix of the two materials; or from the formation of carbide compounds between the refractory metal and the carbon; or where both mechanisms may play an important role. The coating's outer surface is rich in tungsten and the portion of the coating adjacent to the diamond, is rich in carbon. This bonding layer acts as a gradient between 100% diamond and 100% tungsten.

One effect of the invention is significantly improved adhesion of a refractory metal, such as tungsten, on diamond sheets. Diamond sheets, that have undergone the inventive process where about 15 micrometers of tungsten were deposited, exhibited tungsten adhesive values in excess of 10,000 pounds per square inch. This is the limit of detection using a Sebastian Model 1 Adhesion Tester.

In contrast, diamond sheets deposited with about 20 micrometers of tungsten and no heat treatment, showed adhesive values at 0 pounds per square inch. These coatings were generally cracked and delaminated from the substrate upon removal from the reaction chamber. Diamond sheets that had about 16 micrometers of tungsten deposited in one step, and then heat treated, exhibited the same cracked and delaminated deposits with no adhesion of tungsten on the diamond sheet.

An embodiment of the invention is diamond substrates being utilized in 3-dimensional multi-chip modules. Such modules have laser drilled apertures in the diamond where interconnects are needed between the surfaces. The apertures are known as vias. The vias are typically 100–500 micrometers long and have an aspect ratio, length to diameter, in the range of about 0.1 to 100. Vias must be filled with a strongly adherent metal that conducts electricity, such as a refractory metal. Tungsten is a preferred metal.

In this embodiment, the invention significantly improves the adhesion of a metal on diamond surfaces, including the walls of the vias. This is accomplished by initially depositing about a 10–10,000 Ångstrom layer of a refractory metal by low pressure chemical vapor deposition by the hydrogen reduction of tungsten hexafluoride in a non-oxidizing atmosphere at about 300°–700° C. at about 0.1–3.0 torr. The diamond is then heat treated in a non-oxidizing atmosphere at a temperature of about 700°–1200° C. so that a refractory metal-carbon bonding layer forms. The diamond is cooled in the non-oxidizing environment to the deposition process temperature. The deposition of the refractory metal is continued at about 400°–800° C. at about 0.1–3.0 torr until the desired thickness is obtained.

Accordingly, this invention to provides a process for significantly improved adhesion of a thick coating of a single metal on diamond surfaces.

DETAILED DESCRIPTION OF THE INVENTION

In the present invention a process has been discovered that shows significant improvements in the adhesion of a thick deposit of a refractory metal to a diamond substrate. The process entails three essential steps that are performed sequentially: deposition of a thin layer of a refractory metal on diamond; heat treatment of the diamond substrate and refractory metal coating at an elevated temperature; and continued deposition of the refractory metal to a required thickness.

Prior to any metal deposition, sheets of chemical vapor deposited diamond about 8 mils thick are preferably cleaned. This is to assure a contaminant-free diamond surface. The diamond substrate may first be cleaned in either an aqueous solution comprised of hydrogen peroxide for 15–30 minutes at a temperature of 40°–50° C., or in an acid mixture comprised of one part by volume of each of the following acids: nitric, hydrochloric, and hydrofluoric, for a period of two to three hours at the solution's boiling point. Subsequent to the initial cleaning, the diamond substrate may undergo a second cleaning in a mixture comprised of one part by volume nitric acid and three parts by volume sulfuric acid for a period of about three to about four hours at the solution's boiling point. The substrate typically is then rinsed in deionized water, 2-propanol, and air dried.

The substrate is first coated with a layer of a refractory metal. The preferred refractory metal is tungsten. The layer is about 10–10,000 angstroms, with the preferred thickness of the coating about 100–300 angstroms. The initial coating of the refractory metal is deposited at about 300°–700° C., preferably 400°–500° C. at about 0.1–3.0 torr, preferably 0.1–1.0 torr, for about 0.5–1.5 minutes.

The preferred method of deposition of the refractory metal is by low pressure chemical vapor deposition by the hydrogen reduction of tungsten hexafluoride in a non-oxidizing environment. A non-oxidizing environment can be a reducing environment, such as hydrogen, or an inert environment, such as nitrogen. A hydrogen atmosphere is preferred.

For example, using a Phoenix bell jar reactor system, tungsten is initially deposited for one minute at 450° C. by the hydrogen reduction of tungsten hexafluoride at a total pressure of 0.5 torr and a $[H_2]/[WF_6]$ ratio of 12:1 with the corresponding flow rates of 380 and 32 sccm.

Immediately following this first deposition, the substrate is brought up to a temperature of about 700°–1200° C. in a non-oxidizing environment for about 5–60 minutes. The preferred temperature and time for heat treatment are 900°–1000° C. for 30–60 minutes.

Following this heat treatment, the substrate is allowed to cool in the non-oxidizing environment to a temperature at which continued deposition takes place. Once at that temperature, the deposition of the refractory metal is continued until the desired thickness is obtained.

Generally, the deposition is continued at about 400°–800° C. at about 0.1–3.0 torr. The preferred parameters for the deposition of tungsten is about 600°–700° C. at a total pressure of about 0.1–1.0 torr and a $[H_2]/[WF_6]$ ratio of 12:1 with corresponding flow rates of about 380 and about 32 sccm. Such deposition continues for a period of about one hour to yield a coating thickness on the order of about 10–30 micrometers. The substrate is then cooled to room temperature under a continuous flow of hydrogen.

The following examples are presented.

EXAMPLE 1

A sheet of diamond substrate, cleaned as described above, was placed in the reactor, and using a total pressure of 0.5 torr and a $[H_2]/[WF_6]$ ratio of 12:1 with corresponding flow rates of 380 and 32 sccm, the substrate was heated to 650° C. Tungsten was deposited by low pressure chemical vapor deposition for 75 minutes at this temperature, and then the substrate was cooled to room temperature at a rate of 50° C. per 15 minutes. The tungsten coating was cracked and delaminated. It had no adhesion to the substrate. The coating thickness was 20 micrometers, using a Sloan Dektak profilometer to measure the thickness.

EXAMPLE 2

A sheet of diamond substrate, cleaned as described above, was placed in the reactor, and using the gas flow rates and pressures noted above, the substrate was heated to 550° C. Tungsten was deposited by low pressure chemical vapor deposition for 60 minutes at this temperature. The substrate was then heated to 950° C. and held at this temperature for one hour. The substrate was subsequently cooled to room temperature at a rate of 50° C. per 15 minutes. The tungsten coating was cracked and delaminated. It had no adhesion to the diamond substrate. The coating thickness was 16 micrometers. The tungsten coating thickness was measured using a Sloan Dektak profilometer.

EXAMPLE 3

A substrate similar to that of Example 1 was placed in the reactor, and using the gas flow rates and pressures noted above, was heated to 450° C. Tungsten was deposited by low pressure chemical vapor deposition for one minute at this temperature. The substrate was then heated to 990° C. for 30 minutes; then subsequently cooled to 650° C. Tungsten was deposited for 60 minutes at this latter temperature. The substrate was then cooled to room temperature at a rate of 50° C. per 15 minutes. The tungsten coating was not cracked or delaminated. The adhesive strength of the coating was measured as being greater than 10,000 pounds per square inch. The coating thickness was 15 micrometers, measured by a Sloan Dektak profilometer.

The adhesive strength of the coating was measured using a Sebastian Model 1 Adhesion Tester where epoxy coated studs are first attached to the tungsten surface by contacting the two surfaces using a special rig and curing the epoxy for one hour at 150° C. In accordance with the test method an increasing force is applied on the stud so as to pull it away from the substrate. The force at separation is taken as the adhesive strength of the bond between the tungsten coating and the diamond substrate when failure occurs at that interface. The instrument is limited to a force of 10,000 pounds per square inch.

EXAMPLE 4

A substrate similar to that of Example 3 was processed in a manner as described for Example 3, except that the final cooling rate to room temperature was 50° C. per 5 minutes. This was three times faster than the rate in Example 2. Adhesion of the tungsten coating exceeded 10,000 pounds per square inch. The invention has the feature of allowing fast post-processing cooling rates and thus faster processing times.

What is claimed is:

1. A process for improving adhesion of metal coatings on diamond surfaces comprising:
   depositing an initial uniform thin coating of a refractory metal on a diamond surface, wherein the initial coating of the refractory metal is about 10–10,000 angstroms;
   heat treating said initial coating to form a refractory metal-carbon bonding layer with said diamond; and
   then continuing deposition of said refractory metal.

2. A process according to claim 1 wherein said refractory metal is selected from the group consisting of tungsten, niobium, molybdenum, chromium, titanium, vanadium, tantalum, zirconium, hafnium, aluminum, and mixtures of said metals.

3. A process according to claim 1 wherein the heat treatment is conducted at a temperature of about 700°–1200° C. in a non-oxidizing environment.

4. A process according to claim 3 wherein the heat treatment time is about 5–60 minutes.

5. A process according to claim 1 wherein said deposition of said refractory metal takes place by low pressure chemical vapor deposition in a non-oxidizing environment.

6. A process according to claim 5 wherein said initial coating of refractory metal is deposited at about 300°–700° C. at about 0.1–3.0 torr.

7. A process according to claim 5 wherein after heat treatment, deposition of said refractory metal is continued at about 400°–800° C. and at about 0.1–3.0 torr.

8. A process for improving adhesion of tungsten on diamond comprising depositing by low pressure chemical vapor deposition at about 450° C. and at about 0.5 torr an initial tungsten coating of about 200 Å on a diamond surface substantially free of contaminants; heating said diamond to about 900°–1000° C. in a non-oxidizing atmosphere until a tungsten-carbon bonding layer forms with said diamond; and depositing additional tungsten at about 650° C. and at about 0.5 torr.

9. A process according to claim 8 wherein the tungsten coating is formed by the hydrogen reduction of tungsten hexafluoride.

10. A process for improving adhesion of metal to apertures in diamond comprising depositing by low pressure chemical vapor deposition in a non-oxidizing atmosphere about a 10–10,000 Å thick layer of a refractory metal at about 300°–700° C. and at about 0.1–3.0 torr on diamond surfaces and within said apertures; heat treating the deposit thus formed in a non-oxidizing atmosphere at a temperature of about 700°–1200° C. to form a refractory metal-carbon bonding layer with said diamond; then continuing deposition of said refractory metal at about 400°–800° C. and at about 0.1–3.0 torr to substantially fill said apertures.

11. A process according to claim 10 wherein said apertures are vias extending between two surfaces of said diamond substrate.

12. A process according to claim 10 wherein said vias have an aspect ratio in the range of about 0.1 to 100.

13. A process according to claim 10 wherein said refractory metals are selected from the group consisting of tungsten, niobium, molybdenum, chromium, titanium, vanadium, tantalum, zirconium, hafnium, aluminum, and mixtures of said metals.

14. A process according to claim 13 wherein said metal is tungsten.

15. A process according to claim 14 wherein said tungsten is initially deposited at about 450° C. and at about 0.5 torr to a thickness of about 200 Å, then heat treated at about 900°–1000° C. for about 30–60 minutes, followed by further deposition at about 650° C. and at about 0.5 torr.

16. A process according to claim 14 wherein the tungsten is formed by the hydrogen reduction of tungsten hexafluoride.

* * * * *